United States Patent [19]

Buxton

[11] 4,212,265
[45] Jul. 15, 1980

[54] TINNING APPARATUS FOR MULTIPLE SOLDER SURFACES

[75] Inventor: Howard D. Buxton, Phoenix, Ariz.

[73] Assignee: Motorola, Inc., Schaumburg, Ill.

[21] Appl. No.: 929,384

[22] Filed: Jul. 31, 1978

[51] Int. Cl.² ........................................... H01R 43/02
[52] U.S. Cl. ................................. 118/700; 118/59; 118/76; 118/241; 228/19; 228/244
[58] Field of Search .................. 118/59, 241, 76, 506, 118/700; 228/244, 9, 10, 11, 19, 22, 210, 254, 208; 427/123, 81; 29/628, 630 R, 630 A

[56] References Cited

U.S. PATENT DOCUMENTS

| 3,027,858 | 4/1962 | Goodwin | 228/11 |
| 3,460,512 | 8/1959 | Keichler et al. | 118/59 |
| 3,982,047 | 9/1976 | Braden | 427/123 |

*Primary Examiner*—Ralph S. Kendall
*Attorney, Agent, or Firm*—Vincent B. Ingrassia

[57] ABSTRACT

Tinning of a plurality of solder bonding surfaces is accomplished by feeding a predetermined length of solder into each of the plurality of pre-heated surfaces. The apparatus provides for the measurement of the solder wire during a non-tinning portion of the machine operating cycle, thereby conserving cycle time.

3 Claims, 6 Drawing Figures

TINNING APPARATUS FOR MULTIPLE SOLDER SURFACES

FIELD OF THE INVENTION

The invention relates to apparatus for tinning bonding pads for semiconductor chips or the like.

BACKGROUND OF THE INVENTION

When bonding semiconductor chips or the like to bonding pads, it has been common practice to utilize solder preforms to provide adherence and desirable heat transfer characteristics to the assembly. Furthermore, to facilitate handling, a lead frame assembly of, say, forty bonding pads and associated electrical leads may be fabricated as a single assembly, ready for application of the elements to be bonded thereto. Such an assembly is shown in FIG. 1. In order to bond semiconductor chips, for example, to the plurality of bonding pads 12 of FIG. 1, preform solder elements are placed on each bonding pad together with the chips and this plurality of "sandwiches" is heated, preferably in a furnace, to cause adherence of each chip to its respective bonding pad.

The system, as described above, presents some problems in practice: (1) The solder preforms must be larger than necessary to assure total coverage of the chip contact area due to positioning tolerances in placement of the parts of the assembly, (2) the solder preforms may be unknowingly dislodged from the "sandwich" during the process with the result that the chip is not soldered to its corresponding bonding pad, and (3) there is no assurance that the chip will be maintained in a desired position with respect to its bonding pad because of the "float" effect of the molten solder.

Some manufacturers may use manual systems for tinning the bonding pad but these operations are very slow, and, thus, relatively expensive.

SUMMARY OF THE INVENTION

These and other problems inherent in the prior art are mitigated by use of the apparatus of the present invention. The apparatus of the invention tins the bonding pads prior to placement of the semiconductor chip, thereby eliminating the possibility of absence of solder at the time of bonding the chip. The apparatus of the invention also provides tinning for a plurality of bonding surfaces simultaneously, thereby greatly reducing assembly time. The apparatus of the invention also provides for precise measurement of solder wire in advance of the soldering operation which further reduces process time and a controlled "patting" of the hot solder surface is provided to improve the surface preparatory to addition of the chip.

It is therefore an object of the invention to provide simultaneous tinning of a plurality of lead frame connected bonding pads.

It is another object of the invention to eliminate missing solder preforms from bonding pads for semiconductor chips or the like.

It is still another object of the invention to "pat" the hot tinned surface of a plurality of bonding pads to improve the bonding surface for subsequent application of semiconductor chips or the like.

It is a further object of the invention to measure a predetermined volume of solder wire prior to application of the solder to bonding pads, thereby conserving operating cycle time.

These and other objects of the invention will be more readily understood by studying the Detailed Description of the Invention which follows together with the drawings in which:

FIG. 1 illustrates a lead frame assembly comprising a quantity of 40 TO-220 bonding pads together with associated electrical leads, FIG. 2 shows a cross section of one tinning station (and a portion of a second station) of the apparatus of the invention, FIG. 3 illustrates a section view of several stations of the apparatus showing fingers which alternately clamp and "pat" a plurality of bonding pads, FIGS 4a and 4b show a side view of the clamping and "patting" fingers shown from the top in FIG. 3, and FIG. 5 is an overall view of the apparatus of the invention.

DETAILED DESCRIPTION OF THE INVENTION

Figure 1:
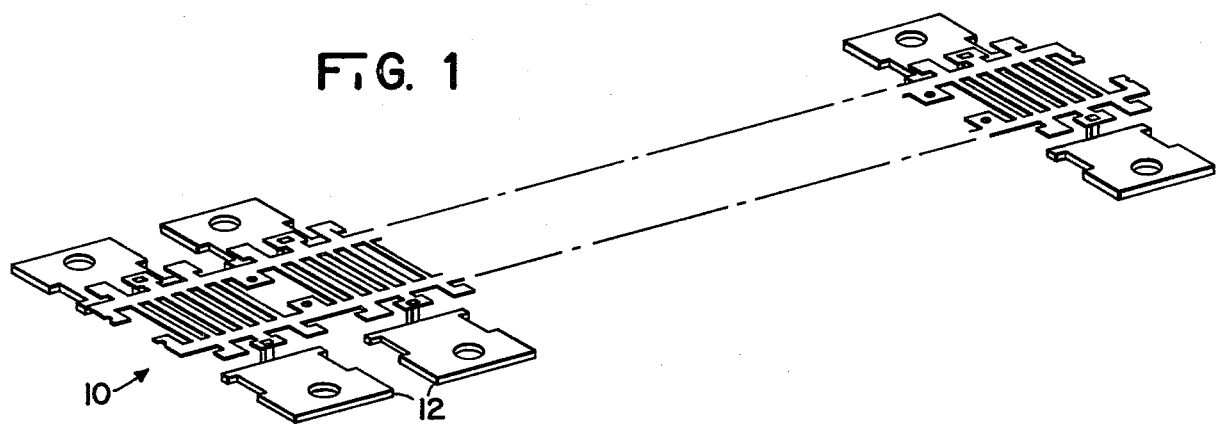
Figure 2:
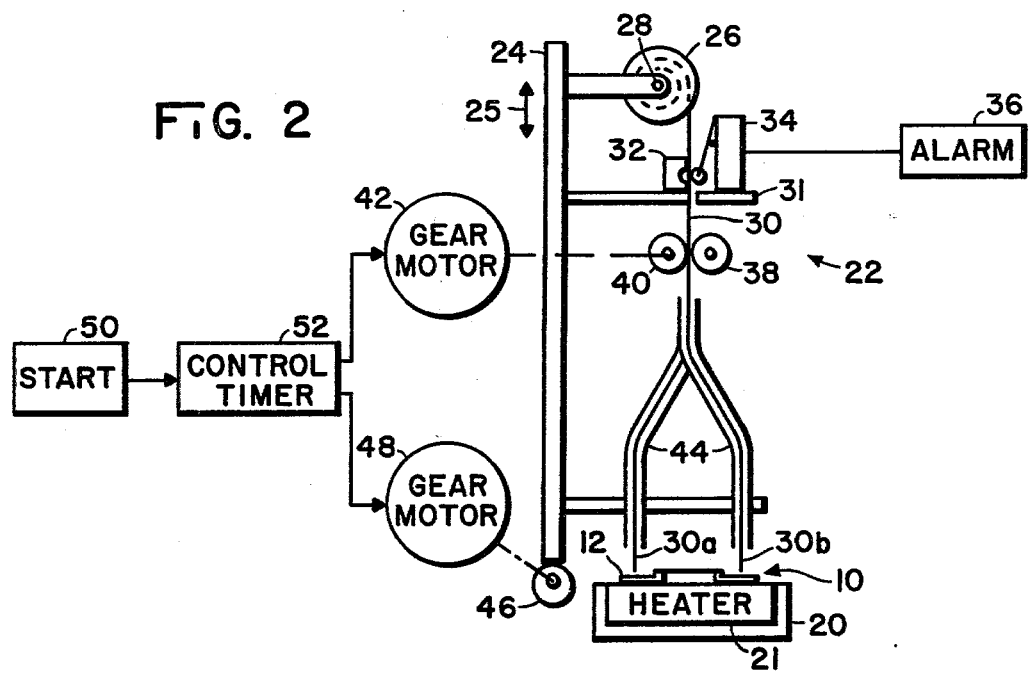
Figure 5:
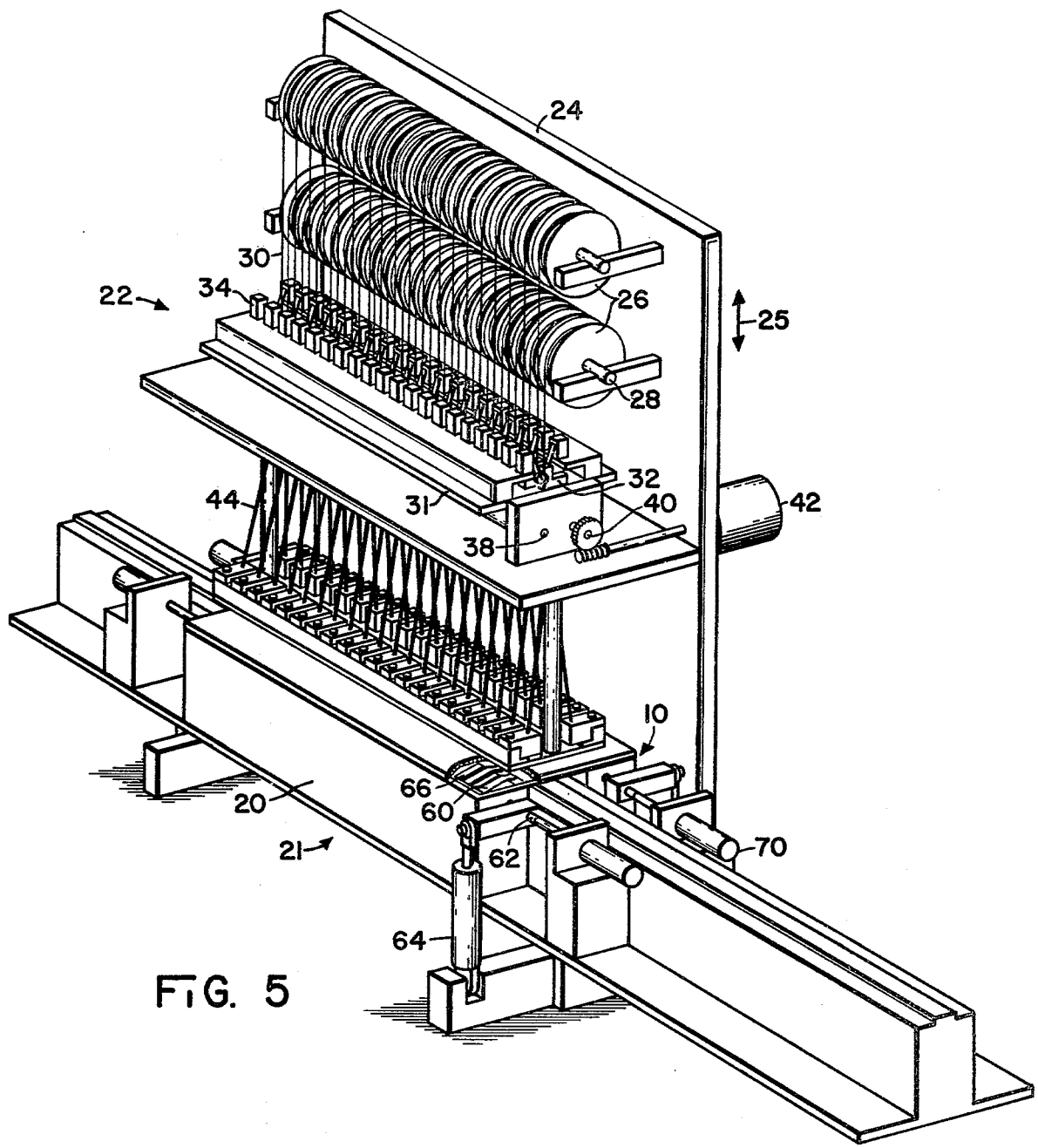

The preferred embodiment of the apparatus of the present invention is configured to tin the bonding surfaces 12 of 40 lead frame units such as are shown at 10 in FIG. 1. FIG. 5 is illustrative of the preferred embodiment of the apparatus of the invention. FIG. 2 shows a typical cross section of the apparatus of FIG. 5. Lead frame assembly 10 is shown positioned with bonding pads 12 in close contact with heater block 20. Heater block 20 is heated by heaters 21 which may be electric heaters. Total assembly 22 may be considered to comprise two basic parts; heater block 20 assembly together with the remainder of the structure as shown in FIG. 2. Backplate 24 is slideably mounted (not shown) so that it may slide in the vertical directions shown by arrows 25. Solder spools 26 are mounted on axle 28 which is supported from backplate 24. In the preferred embodiment of the invention there are 40 solder spools 26, each feeding one of 40 bonding pads 12 which are part of lead frame assembly 10. Solder wire 30 is fed from spool 26 between block 32 and switch 34. In the absence of solder wire 30 the actuator of switch 34 is allowed to move into the recess of block 32 thereby turning on switch 34 and actuating alarm 36. Solder wire 30 proceeds through holes in mounting block 31 for blocks 32 and switches 34 to pinch roller pair 38, 40. Pinch roll 38 is a relatively soft rubber roller. Pinch roller 40 is a metal roller with 40 grooves therein (not shown) for guiding each of the solder wires 30 respectively. Solder wire 30 is then fed into the upper end of one of 40 tubes 44 which is shaped to guide solder wire 30 onto one of the bonding pads 12. It will be clear that only two of 40 bonding pads 12 are shown in FIG. 2. These bonding pads are fed by solder wires 30a and 30b through tubes 44. Of course it will be apparent to one skilled in the art that the position of the lower end of tube 44 may be adjustable in order to assure that solder wire 30 is properly guided to the center of bonding pad 12, in each case. Gear motor 42 drives pinch roller 40. Pinch roll 38 is an idling roller and requires no separate drive. Gear motor 42, in turn, is controlled by control timer 52. Backplate 24 which supports all of the solder wire 30 feed mechanism is vertically positioned by cam 46. As before stated, backplate 24 may be raised and lowered in the directions of arrows 25 by cam 46. Cam 46 is driven by gear motor 48. Gear motor 48 is controlled by control timer 52. The excentricity of cam 46 controls the distance and position of backplate 24, and in turn, the rest of the solder feed mechanism.

In operation, an operator positions lead frame 10 beneath feed mechanism 22. The operator may be aided by a stop detent (not shown). The operator then begins operation of the preferred embodiment of the invention by initiating start mechanism 50. Start mechanism 50 starts control timer 52. Control timer 52 first energizes gear motor 42 for a predetermined length of time to feed a predetermined length of solder wire 30 into tubes 44. Initial apparatus set up assures that solder wires 30 do not contact the surfaces of bonding pads 12. When gear motor 42 is timed off by control timer 52, gear motor 48 starts to turn. When one-half cycle of cam 46 is accomplished, the solder wire previously advanced by gear motor 42 contacts and is driven into the hot surface of each of bonding pads 12.

Figure 3:
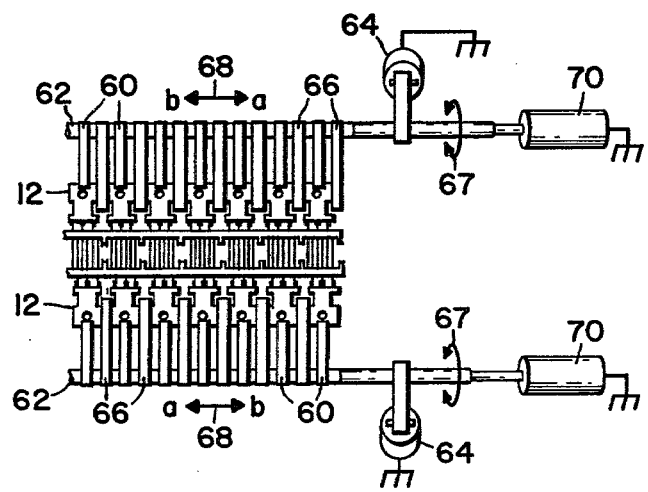
Figure 4A:
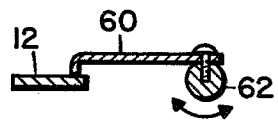
Figure 4B:
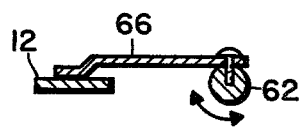

FIG. 3 shows a top view of bonding pads 12, part of lead frame 10 assembly. Short fingers 60 which are mounted on flat sided rotating shaft 62 are driven downward against bonding pads 12 by air operated actuator 64. Long fingers 66, also driven by flat shaft 62, are driven down between bonding pads 12, thereby having no effect. The clamping action of short fingers 60 holds bonding pads 12 tight against heating block 20 during the soldering cycle. (See also FIG. 4a.) When the soldering cycle is complete as determined by control timer 52 and gear motor 48, fingers 60 and 66 are rotated 67 upward away from bonding pads 12. This is accomplished by deactuating air actuator 64. Air actuators 70 are then used to drive flatted shafts 62 in direction b of arrows 68. This longitudinal motion of flatted shaft 62 carries fingers 60 and 66 with it. The total distance travelled is equal to approximately one-half the spacing between adjacent bonding pads 12. This positions long fingers 66 over bonding pads 12. Actuators 64 are then again actuated to rotate long fingers 66 down into the hot solder area of bonding pads 12. (See also FIG. 4b.) Long fingers 66 are made of a material to which solder will not adhere. Long fingers 66 thereby perform a patting action on the surfaces of bonding pads 12, thus spreading out and flattening the solder on bonding pads 12.

At the conclusion of the patting cycle of long fingers 66 control timer 52 deactuates air actuators 64 to release lead frame assembly 10 from heated block 20. Air actuators 70 are then operated by control timer 52 to return flatted shafts 62 to their original position denoted by arrow 68a. Meanwhile the operator physically removes lead frame assembly 10 from the apparatus and replaces it with a new lead frame 10. The operator then begins the cycle again by initiating start activation mechanism 50. This completes the operational and structural description of the preferred embodiment of the invention.

It may be seen that the preferred embodiment of the invention provides for tinning 40 bonding pads 12 of lead frames 10 (see FIG. 1) simultaneously. Feeding of solder wire 30 may be accomplished during a portion of the cylce usually used for loading the machine with lead frame 10 assemblies. Solder wire 30 is accurately measured by the mechanism of the invention. An empty solder wire spool 26 is brought to the attention of the operator by means of alarm 36.

Various other modifications and changes may be made to the present invention from the principles of the invention described above without departing from the spirit and scope thereof as encompassed in the accompanying claims.

What is claimed is:

1. Apparatus for solder tinning a plurality of bonding surfaces simultaneously, the apparatus comprising in combination:
   solder feeding means for depositing a predetermined quantity of solder simultaneously on each of the plurality of bonding surfaces;
   preheater means for raising the temperature of the plurality of bonding surfaces to the melting temperature of said solder; and
   timer means for controlling said solder feeding means to deposit said predetermined quantity of solder on each of the plurality of bonding surfaces.

2. The apparatus according to claim 1 wherein said solder feeding means further comprises:
   pinch roller means for advancing said predetermined quantity of solder from a plurality of rolls of wire solder in one direction;
   structural means for supporting said solder feeding means; and
   cam means for moving said structural means in said one direction and then in a direction opposite said one direction, said cam means being adapted to move said solder means less than or equal to said advancing of said predetermined quantity of solder in either of said directions.

3. The apparatus according to claim 1 wherein the apparatus further comprises in combination:
   means for holding the plurality of bonding surfaces in close contact with said heating means; and
   means for reducing a surface tension effect of said solder on said bonding surfaces, said reducing means comprising a flat surface applied to contact said solder on said bonding surface, said flat surface being made of a non-solderable material.

* * * * *